United States Patent [19]

Kinoshita

[11] Patent Number: 5,768,698
[45] Date of Patent: Jun. 16, 1998

[54] RADIO RECEIVING SYSTEM WITH ADAPTIVE ANTENNAS HAVING REDUCED VARIATION OF AMPLIFICATION

[75] Inventor: Norihito Kinoshita, Tokyo, Japan

[73] Assignee: Matsushita Electric Industrial Co., Ltd., Osaka, Japan

[21] Appl. No.: 548,634

[22] Filed: Oct. 26, 1995

[30] Foreign Application Priority Data

Oct. 31, 1994 [JP] Japan .................. 6-288709

[51] Int. Cl.$^6$ .................. H04B 1/06; H04B 7/00
[52] U.S. Cl. .................. 455/273; 455/138; 455/234.2
[58] Field of Search .................. 455/133–136, 455/138, 234.1, 234.2, 241.1, 242.1, 245.1, 246.1, 250.1, 132, 296, 137; 370/95.3, 321; 375/345, 243, 347

[56] References Cited

U.S. PATENT DOCUMENTS

| | | | |
|---|---|---|---|
| 4,513,412 | 4/1985 | Cox | 455/134 |
| 4,857,928 | 8/1989 | Gailus et al. | 375/243 |
| 5,086,437 | 2/1992 | Tomita | 455/234.1 |
| 5,119,508 | 6/1992 | Shamasundara | 455/234.1 |
| 5,184,349 | 2/1993 | Riordan | 455/234.1 |
| 5,361,404 | 11/1994 | Dent | 455/138 |
| 5,436,933 | 7/1995 | Andruzzi, Jr. | 455/234.1 |
| 5,493,712 | 2/1996 | Ramesh et al. | 455/234.2 |

OTHER PUBLICATIONS

Takeo Ohgane et al, A Design of GMSK/TDMA System with Adaptive Array in Land Mobile Radio Communications, pp. 71–74.

*Primary Examiner*—Reinhard J. Eisenzopf
*Assistant Examiner*—Sam Bhattacharya
*Attorney, Agent, or Firm*—Lowe Hauptman; Gopstein & Berner

[57] ABSTRACT

A receiving system comprises a plurality of receiving branches 1, 2, - - - n each including an adaptive antenna. A variable gain controlled amplifier 31, 32, - - - 3n is provided in each receiving branch 1,2, - - - n for setting an amplification factor of a receiving signal in each receiving branch. Automatic gain control unit 7 inputs receiving signals from the plural receiving branches 1,2, - - - and n at predetermined sampling intervals and controls the amplification factors of the variable gain controlled amplifiers 31, 32, - - - 3n. An adaptive antenna processing unit 8 performs an adaptive antenna processing based on the receiving signals sent from the plural receiving branches 1,2, - - - n. A timing control device 71, 72 or 73 allows the automatic gain control unit 7 to renew the amplification factor of each variable gain controlled amplifier 31, 32, - - - 3n in response to each elapse of a predetermined interval longer than the sampling interval of the automatic gain control unit 7. The automatic gain control unit 7 independently controls the amplification factors of the variable gain controlled amplifiers 31, 32, - - - 3n.

20 Claims, 11 Drawing Sheets

RADIO RECEIVING SYSTEM WITH ADAPTIVE ANTENNAS HAVING REDUCED VARIATION OF AMPLIFICATION

BACKGROUND OF THE INVENTION

1. Field of the Invention

The present invention relates to a radio receiving apparatus equipped with adaptive antennas, for example, used in the system for land mobile radio communications, and more particularly to improvement of receiver performance and reduction of consumption electric power in the system.

2. Prior Art

In the land mobile radio communications, radio receivers are generally subjected to interference waves arriving from various directions. For this reason, a conventional technology provides a plurality of nondirectional antennas for a radio receiver. The gain and phase of a receiving signal outputted from each branch is adaptively controlled, and synthesized with other receiving signals of residual branches to obtain a desirable directionality.

FIG. 8 is a schematic block diagram showing such a conventional radio receiving system equipped with a total of n adaptive antenna branches. As shown in FIG. 8, each of branch 1 through branch n comprises an antenna $1j$ ($j=1,2,---,$ or n) receiving radio wave signals, a frequency converter $2j$ ($j=1,2,---,$ or n) converting the receiving signal into an IF (intermediate frequency) signal, a variable gain controlled amplifier $3j$ ($j=1,2,---,$ or n) adjusting the level of the receiving signal by varying the amplification factor thereof, a quadrature detector $4j$ ($j=1,2,---,$ or n) producing I and Q signals from the receiving signal of IF frequency band, and A/D converters $5j$ and $6j$ ($j=1,2,---,$ or n) converting the I and Q signals into digital signals. The system further comprises an automatic gain control unit 7 controlling the amplification factors of variable gain controlled amplifiers $3_1$ through $3_n$, an adaptive antenna processing unit 8 synthesizing signals received in the plural antennas $1_1$ through $1_n$ and removing distortion, and a demodulator 81 demodulating the receiving signals outputted from the adaptive antenna processing unit 8 and converting them into receiving data.

According to the above-described radio receiving system, the arriving radio wave is received by the antennas $1_1$ through $1_n$ positioned at spatially different positions. The radio wave, received in each of the respective antennas $1_1$ through $1_n$, is converted into an IF signal in each of frequency converters $2_1$ through $2_n$. The signal level of the IF signal is adjusted in each of the variable gain controlled amplifier $3_1$ through $3_n$ so as to narrow the dynamic range of the following stage and reduce the quantization errors in the A/D converters $5_1 --- 5_n$ and $6_1 --- 6_n$.

The receiving signal with a signal level thus adjusted is subsequently converted into an I signal (i.e. an in-phase component) and a Q signal (i.e. a quadrature component) in each of the quadrature detectors $4_1$ through $4_n$. The I signal and Q signal are then converted into digital data in respective A/D converters $5_1 --- 5_n$ and $6_1 --- 6_n$.

The automatic gain control unit 7 selects an antenna having the largest electric power in its receiving signal based on the digital data representing the I signal and Q signal of each antenna. Then, amplification factors of the variable gain controlled amplifiers $3_1$ through $3_n$ are uniformly controlled in comparison with the selected receiving signal serving as a reference value. In this case, commonly controlling the amplification factors of variable gain controlled amplifiers $3_1$ through $3_n$ will automatically maintain the linearity among antennas $1_1$ through $1_n$ and an amplitude ratio among antennas $1_1$ through $1_n$ at the antenna input condition which is univocally determined based on receiving performance and installation position of antennas.

The control of the amplification factors of variable gain controlled amplifiers $3_1$ through $3_n$ is so closely related to a processing algorithm of adaptive antennas that the performance of the radio receiver is substantially determined by it.

After the signal levels are adjusted, the adaptive antenna processing unit 8 processes the I signals and Q signals of respective antennas $1_1$ through $1_n$ by CMA (Constant Modulus Algorithm) etc, thereby removing distortion involved in the receiving signals and improving receiving performance. The demodulator 81 demodulates the receiving signals outputted from the adaptive antenna unit 8 and converts them into receiving data.

However, according to the above-described conventional radio receiving system equipped with plural adaptive antennas, uniform control of amplification factors of respective variable gain controlled amplifiers $3_1 --- 3_n$ by the automatic gain control unit 7 will cause the following problems.

Compared with the receiving signal designated as reference for control, a receiving signal having an extremely small receiving power will be subjected to undesirable increase of the quantization error in the A/D conversion and performance deterioration of adaptive antennas.

Furthermore, the automatic gain control unit 7 performs the control of the variable gain controlled amplifiers $3_1$ through $3_n$ in response to every entry of sampling data of the produced digital signal. Thus, the consumption current will undesirably increase in proportion to the arithmetic operation of the control of the variable gain controlled amplifiers $3_1$ through $3_n$. Moreover, the amplification factors of the variable gain controlled amplifiers $3_1$ through $3_n$ cause ceaseless variation or fluctuation which possibly induces a deterioration of signal processing performance in the adaptive antennas.

SUMMARY OF THE INVENTION

Accordingly, in view of above-described problems encountered in the prior art, a principal object of the present invention is to provide an excellent radio receiving system equipped with adaptive antennas used in the land mobile radio communication which is capable of reducing the quantization error in the A/D conversion and suppressing the fluctuation of the amplification factors in the variable gain controlled amplifiers to improve the receiving performance of the adaptive antennas, and decreasing the consumption electric power in the system.

In order to accomplish this and other related objects, as shown in FIG. 9, a first aspect of the present invention provides a radio receiving system equipped with plural adaptive antennas comprising: a plurality of receiving branches M1 each including an adaptive antenna; variable gain controlled amplification means M2 provided in each receiving branch M1 for setting an amplification factor of a receiving signal in each receiving branch M1; gain control means M3 for inputting the receiving signal from each receiving branch M1 at predetermined sampling intervals and controlling the amplification factor of each variable gain controlled amplification means M2; adaptive antenna processing means M4 for performing an adaptive antenna processing based on the receiving signal sent from each receiving branch M1; and timing control means M5 for allowing the gain control means M3 to renew the amplification factor of each variable gain controlled amplification means M2 in response to each elapse of a predetermined interval longer than the sampling interval of the gain control means M3.

Furthermore, as shown in FIG. 10, a second aspect of the present invention provides a radio receiving system equipped with plural adaptive antennas comprising: a plurality of receiving branches M11, M12, - - - and M1n each including an adaptive antenna; variable gain controlled amplification means M21, M22, - - - or M2n provided in each receiving branch M11, M12, - - - or M1n for setting an amplification factor of a receiving signal in each receiving branch M11, M12, - - - or M1n; gain control means M3 for inputting receiving signals from plural receiving branches M11, M12, - - - and M1n at predetermined sampling intervals and controlling the amplification factors of variable gain controlled amplification means M21, M22, - - - and M2n; and adaptive antenna processing means M4 for performing an adaptive antenna processing based on the receiving signals sent from plural receiving branches M11, M12, - - - and M1n, wherein the gain control means M3 independently controls the amplification factors of variable gain controlled amplification means M21, M22, - - - and M2n.

Moreover, as shown in FIG. 11, a third aspect of the present invention provides a radio receiving system equipped with plural adaptive antennas comprising: a plurality of receiving branches M11, M12, - - - and M1n each including an adaptive antenna; variable gain controlled amplification means M21, M22, - - - or M2n provided in each receiving branch M11, M12, - - - or M1n for setting an amplification factor of a receiving signal in each receiving branch M11, M12, - - - or M1n; gain control means M3 for inputting receiving signals from the plural receiving branches M11, M12, - - - and M1n at predetermined sampling intervals and controlling the amplification factors of the variable gain controlled amplification means M21, M22, - - - and M2n; adaptive antenna processing means M4 for performing an adaptive antenna processing based on the receiving signals sent from the plural receiving branches M11, M12, - - - and M1n; and timing control means M5 for allowing the gain control means M3 to renew the amplification factor of each variable gain controlled amplification means M2 in response to each elapse of a predetermined interval longer than the sampling interval of the gain control means M3, wherein the gain control means M3 independently controls the amplification factors of the variable gain controlled amplification means M21, M22, - - - and M2n.

In the above first and third aspects of the present invention, it is desirable that the timing control means M5 is a counting means for counting the number of receiving signals sampled by the gain control means M3, and the gain control means M3 is allowed to renew the amplification factor of each variable gain controlled amplification means M2, M2j (j=1,2, - - - , or n) every time the counting means counts to "m", where "m" is an integer larger than 1.

Still further, the timing control means M5 is a frame timing detecting means for detecting the units of a frame in the receiving signal, and the gain control means M3 is allowed to renew the amplification factor of each variable gain controlled amplification means M2, M2j (j=1,2, - - - , or n) every time the frame timing detecting means detects "n" frames, where "n" is an integer not smaller than 1.

Yet further, the timing control means M5 is a training timing detecting means for detecting a training interval in the adaptive antenna processing means M4, and the gain control means M3 is allowed to renew the amplification factor of each variable gain controlled amplification means M2, M2j (j=1,2, - - - , or n) every time the training timing detecting means detects the training interval.

In accordance with the arrangement of the present invention, the gain control means M3 performs the control of amplification factors of variable gain controlled amplification means M2, M2j (j=1,2, - - - , or n) at predetermined intervals sufficiently longer than the sampling interval of the receiving signals entered into the gain control means M3. Thus, reduction of the arithmetic time or volume can be appropriately realized as well as reduction of consumption of electric power.

Furthermore, as the amplification factors of the variable gain controlled amplification means M2, M2j (j=1,2, - - - , or n) are maintained at constant values for that interval between executions of control, the fluctuation of the amplification factors is effectively suppressed within an allowable range, thereby improving the performance in the adaptive antenna processing.

Moreover, executing the individual control of the amplification factors of variable gain controlled amplification means M2, M2j (j=1,2, - - - , or n) is useful to effectively suppress quantization errors in the A/D conversion in each branch. Thus, the performance in the adaptive antenna processing is further improved, increasing an overall receiving performance of the radio receiving system.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1:
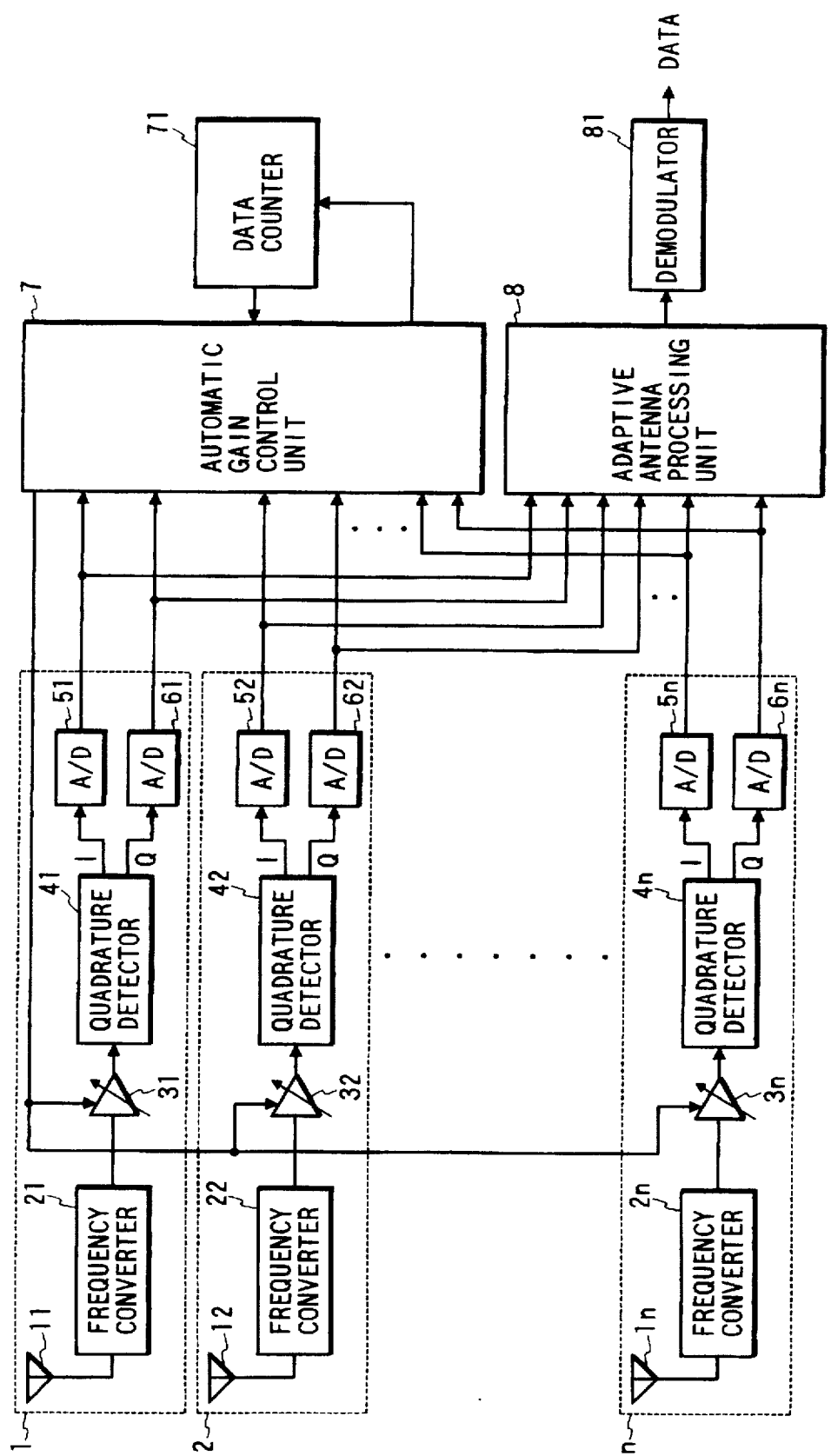
FIG. 1 is a block diagram showing a schematic arrangement of a radio receiving system equipped with plural adaptive antennas in accordance with a first embodiment of the present invention.

Preferred embodiments of the present invention will be explained in greater detail hereinafter, with reference to the accompanying drawings. Identical parts are denoted by identical reference numeral throughout views.

First Embodiment

FIG. 1 is a schematic block diagram showing the first embodiment of the present invention which is characterized by the provision of a data counting means.

The radio receiving system is equipped with a total of n adaptive antenna branches. As shown in FIG. 1, each branch j (j=1,2, - - - , or n) comprises an exclusive antenna $1j$ (j=1,2, - - - , or n) receiving radio wave signals, a frequency converter $2j$ (j=1,2, - - - , or n) connected to the antenna $1j$ (j=1,2, - - - , or n) for converting the receiving signal into an IF (intermediate frequency) signal, a variable gain controlled amplifier $3j$ (j=1,2, - - - , or n) connected to the frequency converter $2j$ (j=1,2, - - - , or n) for adjusting the level of the receiving signal by varying the amplification factor thereof, a quadrature detector $4j$ (j=1,2, - - - , or n) connected to the variable gain controlled amplifier $3j$ (j=1,2, - - - , or n) for producing I (i.e. in-phase) and Q (i.e. quadrature) signals from the receiving signal of IF frequency band, and A/D converters $5j$ and $6j$ (j=1,2, - - - , or n) connected to the quadrature detector $4j$ (j=1,2, - - - , or n) for converting the I and Q signals into digital signals.

The system further comprises an automatic gain control unit 7 receiving digital signals from the A/D converters $5j$ and $6j$ (j=1,2, - - - , or n) and controlling the amplification factors of variable gain controlled amplifiers $3_1$ through $3_n$, an adaptive antenna processing unit 8 receiving digital signals from the A/D converters $5j$ and $6j$ (j=1,2, - - - , or n) for synthesizing signals received in the plural antennas $1_1$ through $1_n$ and removing distortion, and a demodulator 81 connected to the adaptive antenna processing unit 8 for demodulating the receiving signals outputted from the adaptive antenna processing unit 8 and converting them into receiving data.

In addition to the above arrangement, the first embodiment of the present invention includes a data counter 71 which is connected to the automatic gain control unit 7 to count the number of receiving signals entered into the automatic gain control unit 7. The automatic gain controller 7 responds to a count-up data supplied from the data counter 71 to control the amplification factors of the variable gain controlled amplifiers $3_1$ through $3_n$ every time the data counter 71 counts up a predetermined number.

According to the above-described first embodiment radio receiving system, the arriving radio wave is received by a total of "n" antennas $1_1$ through $1_n$ positioned at spatially different positions. The radio wave, received in each of the respective antennas $1_1$ through $1_n$, is converted into an IF signal in each of frequency converters $2_1$ through $2_n$. The signal level of the IF signal is adjusted in each of the variable gain controlled amplifier $3_1$ through $3_n$ so as to narrow the dynamic range of the following stage and reduce the quantization errors in the A/D converters $5_1$ - - - $5_n$ and $6_1$ - - - $6_n$.

The receiving signal with a signal level thus adjusted is subsequently converted into an I signal (i.e. an in-phase component) and a Q signal (i.e. a quadrature component) in each of the quadrature detectors $4_1$ through $4_n$. The I signal and Q signal are then converted into digital data in respective A/D converters $5_1$ - - - $5_n$ and $6_1$ - - - $6_n$.

Thus converted digital signal is subsequently entered into the automatic gain control unit 7, and the data counter 71 counts the sampling number of digital signals entered.

When the count number of the data counter 71 reaches a predetermined number "m", the automatic gain control unit 7 selects an antenna having the largest electric power in its receiving signal based on the digital data representing the I signal and Q signal of each antenna. Then, amplification factors of the variable gain controlled amplifiers $3_1$ through $3_n$ are uniformly controlled in comparison with the selected receiving signal serving as a reference value. In this case, commonly controlling the amplification factors of variable gain controlled amplifiers $3_1$ through $3_n$ will maintain the linearity among antennas $1_1$ through $1_n$ and an amplitude ratio among antennas $1_1$ through $1_n$ at the antenna input condition which is univocally determined based on receiving performance and installation position of antennas.

Accordingly, the control of the amplification factors of variable gain controlled amplifiers $3_1$ through $3_n$ is performed in response to every "m" times entry (or sampling) of receiving signal data. Thus, during a predetermined interval corresponding to the "m" times entry (or sampling) of the receiving signal data, the amplification factors of the variable gain controlled amplifiers $3_1$ through $3_n$ are maintained at the same values obtained in the previous control. For this reason, the arithmetic time or volume according to the first embodiment control is reduced to 1/m compared with that of the conventional control which performs the arithmetic operation in response to every input of a receiving signal.

After the signal levels are adjusted, the adaptive antenna processing unit 8 processes the I signals and Q signals of respective antennas $1_1$ through $1_n$ by CMA (Constant Modulus Algorithm) etc. thereby removing distortion involved in the receiving signals and improving receiving performance. The demodulator 81 demodulates the receiving signals outputted from the adaptive antenna unit 8 and converts them into receiving data.

In this manner, the first embodiment of the present invention provides a radio receiving system equipped with plural adaptive antennas which is capable of performing the control of amplification factors of variable gain controlled amplifiers $3_1$ through $3_n$ in response to each elapse of the predetermined interval longer than the sampling interval of the receiving signals. Hence, it becomes possible to reduce the total arithmetic time or volume for the control of the amplification factors of variable gain controlled amplifiers $3_1$ through $3_n$. Furthermore, as the amplification factors of the variable gain controlled amplifiers $3_1$ through $3_n$ are maintained at constant values for that interval between executions of control, the fluctuation of the amplification factors is effectively suppressed within an allowable range, thereby improving the performance in the adaptive antenna processing.

Second Embodiment

Figure 2:
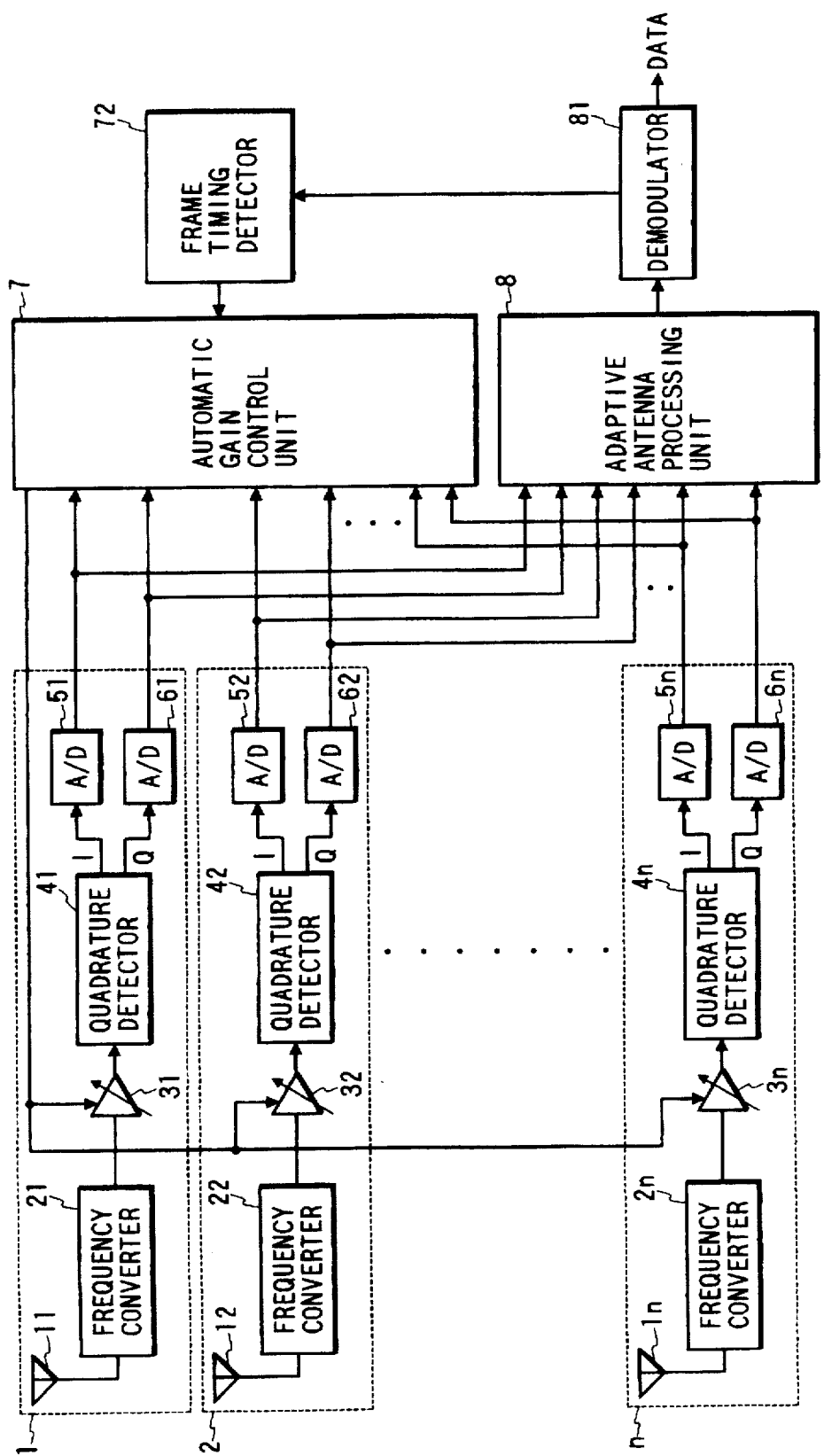
FIG. 2 is a block diagram showing a schematic arrangement of a radio receiving system equipped with plural adaptive antennas in accordance with a second embodiment of the present invention.

FIG. 2 is a schematic block diagram showing the second embodiment of the present invention which is characterized by the provision of a frame timing detecting means.

The circuit arrangement of the second embodiment is the same as the above-described first embodiment except that the data counter 71 is replaced by a frame timing detector 72. The frame timing detector 72 of the second embodiment, connected between the demodulator 81 and the automatic gain control unit 7, detects the units of frame, such as a TDM (Time Division Multiplex) frame, a TDMA (Time Division Multiple Access) frame, a frame of interleave or a frame of error correction, based on the demodulated signals.

The automatic gain control unit 7 controls the amplification factors of the variable gain controlled amplifiers $3_1$ through $3_n$ in response to every detection of the designated timing detected by the frame timing detector 72.

According to the above-described second embodiment radio receiving system, the arriving radio wave is received by a total of "n" antennas $1_1$ through $1_n$ positioned at spatially different positions. The radio wave, received in each of the respective antennas $1_1$ through $1_n$, is converted into an IF signal in each of frequency converters $2_1$ through $2_n$. The signal level of the IF signal is adjusted in each of the variable gain controlled amplifier $3_1$ through $3_n$ so as to narrow the dynamic range of the following stage and reduce the quantization errors in the A/D converters $5_1$ - - - $5_n$ and $6_1$ - - - $6_n$.

The receiving signal with a signal level thus adjusted is subsequently converted into an I signal and a Q signal in each of the quadrature detectors $4_1$ through $4_n$. The I signal and Q signal are then converted into digital data in respective A/D converters $5_1$ - - - $5_n$ and $6_1$ - - - $6_n$.

Thus converted digital signal is subsequently entered into the automatic gain control unit 7

Meanwhile, the adaptive antenna processing unit 8 processes the I signals and Q signals of respective antennas $1_1$ through $1_n$ by CMA etc. thereby removing distortion involved in the receiving signals and improving receiving performance. The demodulator 81 demodulates the receiving signals outputted from the adaptive antenna unit 8 and converts them into receiving data. The frame timing detector 72 detects the frame unit, such as a TDM frame, a TDMA frame, a frame of interleave or a frame of error correction, based on the receiving signals demodulated in the demodulator 81. Upon detecting the designated frame unit, the frame timing detector 72 sends a control timing signal to the automatic gain control unit 7.

In response to this control timing signal, the automatic gain control unit 7 selects an antenna having the largest electric power in its receiving signal based on the digital data representing the I signal and Q signal of each antenna. Then, amplification factors of the variable gain controlled amplifiers $3_1$ through $3_n$ are uniformly controlled in comparison with the selected receiving signal serving as a reference value. In this case, commonly controlling the amplification factors of variable gain controlled amplifiers $3_1$ through $3_n$ will maintain the linearity among antennas $1_1$ through $1_n$ and an amplitude ratio among antennas $1_1$ through $1_n$ at the antenna input condition.

Accordingly, the control of the amplification factors of variable gain controlled amplifiers $3_1$ through $3_n$ is performed at predetermined intervals equivalent to the units of the designated frame (or the units of a multiple of the designated frame). Thus, during a duration of the same frame, the amplification factors of the variable gain controlled amplifiers $3_1$ through $3_n$ are maintained at the same values. For this reason, the arithmetic time or volume according to the second embodiment control is reduced to a certain degree compared with that of the conventional control which performs the arithmetic operation in response to every input of a receiving signal.

In this manner, the second embodiment of the present invention provides a radio receiving system equipped with plural adaptive antennas which is capable of performing the control of amplification factors of variable gain controlled amplifiers $3_1$ through $3_n$ in response to each elapse of the predetermined interval equivalent to the designated frame unit which is longer than the sampling interval of the receiving signals. Hence, it becomes possible to reduce the total arithmetic time or volume for the control of the amplification factors of variable gain controlled amplifiers $3_1$ through $3_n$, resulting in reduction of consumption electric power. Furthermore, as the amplification factors of the variable gain controlled amplifiers $3_1$ through $3_n$ are maintained at constant values for an interval corresponding to the same frame, the fluctuation of the amplification factors is effectively suppressed within an allowable range, thereby improving the performance in the adaptive antenna processing.

Third Embodiment

Figure 3:
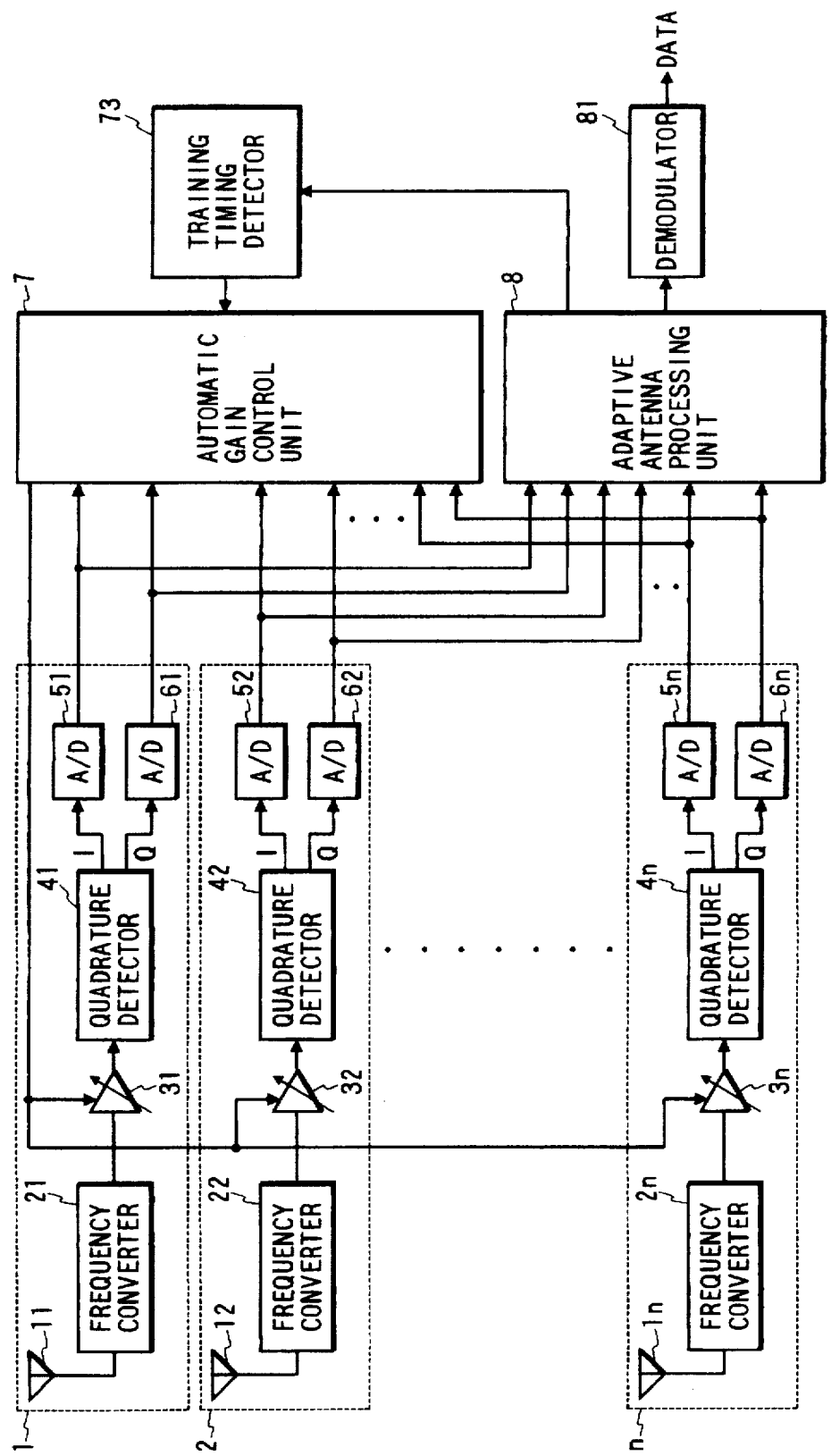
FIG. 3 is a block diagram showing a schematic arrangement of a radio receiving system equipped with plural adaptive antennas in accordance with a third embodiment of the present invention.

FIG. 3 is a schematic block diagram showing the third embodiment of the present invention which is characterized by the provision of a training timing detecting means.

More specifically, the radio receiving system equipped with plural adaptive antennas according to the third embodiment includes the adaptive antenna processing unit 8 which uses algorithms requiring a training sequence, such as Least Mean Square Error (LMS) algorithm or the like.

The circuit arrangement of the third embodiment is the same as the above-described first embodiment except that the data counter 71 is replaced by a training timing detector 73. The training timing detector 73 of the third embodiment, connected between the adaptive antenna processing unit 7 and the automatic gain control unit 7, detects an initiation of the training sequence in the adaptive antenna processing unit 8, in order to perform the control of the variable gain controlled amplifiers $3_1$ through $3_n$ once during the interval of the concerned training sequence. The training timing detector 73 generates a control timing signal upon detecting the initiation of training sequence in the adaptive antenna processing unit 8.

The automatic gain control unit 7 controls the amplification factors of the variable gain controlled amplifiers $3_1$ through $3_n$ in response to every control signal sent from the training timing detector 73.

According to the above-described third embodiment radio receiving apparatus, a known signal is detected during the training interval of a constant period, and adjustment of signal level and signal processing are trained. Namely, the arriving radio wave is received by a total of "n" antennas $1_1$ through $1_n$ positioned at spatially different positions. The radio wave, received in each of the respective antennas $1_1$ through $1_n$, is converted into an IF signal in each of frequency converters $2_1$ through $2_n$. The signal level of the IF signal is adjusted in each of the variable gain controlled amplifier $3_1$ through $3_n$ so as to narrow the dynamic range of the following stage and reduce the quantization errors in the A/D converters $5_1$ - - - $5_n$ and $6_1$ - - - $6_n$.

The receiving signal with a signal level thus adjusted is subsequently converted into an I signal and a Q signal in each of the quadrature detectors $4_1$ through $4_n$. The I signal and Q signal are then converted into digital data in respective A/D converters $5_1$ - - - $5_n$ and $6_1$ - - - $6_n$.

Thus converted digital signal is subsequently entered into the automatic gain control unit 7.

Meanwhile, the adaptive antenna processing unit 8 processes the I signals and Q signals of respective antennas $1_1$ through $1_n$ by CMA etc. thereby removing distortion involved in the receiving signals and improving receiving performance. The demodulator 81 demodulates the receiving signals outputted from the adaptive antenna unit 8 and converts them into receiving data.

The training timing detector 73 detects an initiation of the training sequence in the adaptive antenna processing unit 8, and sends a control timing signal to the automatic gain control unit 7 upon detection of the initiation of the training sequence.

In response to every entry (or a predetermined number of entries) of this control timing signal sent from the training timing detector 73, the automatic gain control unit 7 selects an antenna having the largest electric power in its receiving signal based on the digital data representing the I signal and Q signal of each antenna. Then, amplification factors of the variable gain controlled amplifiers $3_1$ through $3_n$ are uniformly controlled in comparison with the selected receiving signal serving as a reference value. In this case, commonly controlling the amplification factors of variable gain controlled amplifiers $3_1$ through $3_n$ will maintain the linearity among antennas $1_1$ through $1_n$ and an amplitude ratio among antennas $1_1$ through $1_n$ at the antenna input condition.

Accordingly, the control of the amplification factors of variable gain controlled amplifiers $3_1$ through $3_n$ is performed at predetermined intervals equivalent to the units of the designated training interval (or the units of a multiple of the designated training interval). Thus, during a duration from one training interval to the next training interval, the amplification factors of the variable gain controlled amplifiers $3_1$ through $3_n$ are maintained at the same values. For this reason, the arithmetic time or volume according to the third embodiment control is reduced to a certain degree compared with that of the conventional control which performs the arithmetic operation in response to every input of a receiving signal.

In this manner, the third embodiment of the present invention provides a radio receiving system with adaptive antennas which is capable of performing the control of amplification factors of variable gain controlled amplifiers $3_1$ through $3_n$ in response to each elapse of the predetermined interval equivalent to the units of the predesignated training interval which is longer than the sampling interval of the receiving signals. Hence, it becomes possible to reduce the total arithmetic time or volume for the control of the amplification factors of variable gain controlled amplifiers $3_1$ through $3_n$, resulting in reduction of consumption electric power. Furthermore, as the amplification factors of the variable gain controlled amplifiers $3_1$ through $3_n$ are maintained at constant values until the next training interval, the fluctuation of the amplification factors is effectively suppressed within an allowable range, thereby improving the performance in the adaptive antenna processing.

Fourth Embodiment

Figure 4:
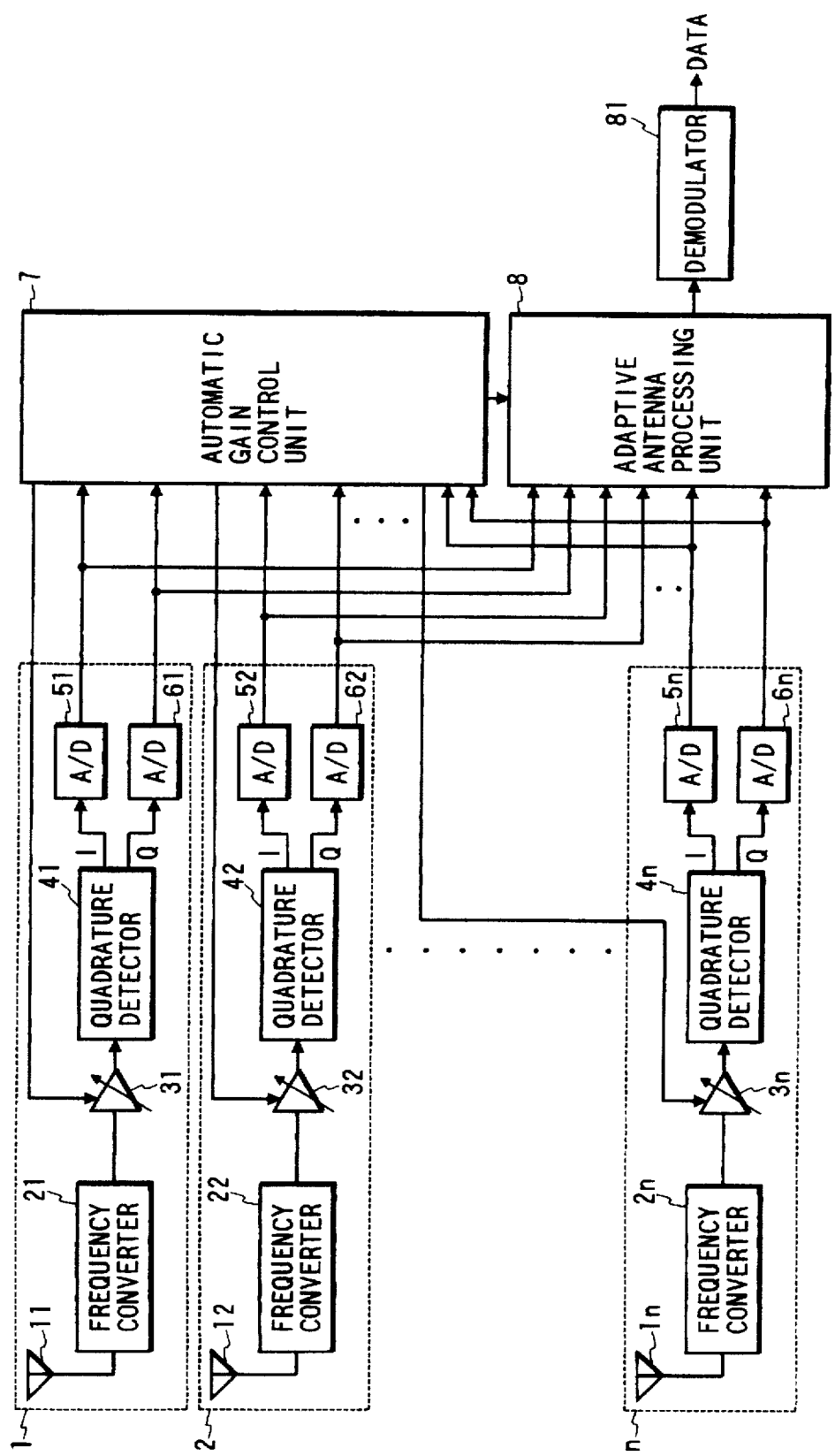
FIG. 4 is a block diagram showing a schematic arrangement of a radio receiving system equipped with plural adaptive antennas in accordance with a fourth embodiment of the present invention.

FIG. 4 is a schematic block diagram showing the fourth embodiment of the present invention which is characterized by the individual control of amplification factors of the variable gain controlled amplifiers.

The radio receiving system is equipped with a total of n adaptive antenna branches. As shown in FIG. 4, each branch j (j=1,2, - - -, or n) comprises an exclusive antenna 1j (j=1,2, - - -, or n) receiving radio wave signals, a frequency converter 2j (j=1,2, - - -, or n) connected to the antenna 1j (j=1,2, - - -, or n) for converting the receiving signal into an IF (intermediate frequency) signal, a variable gain controlled amplifier 3j (j=1,2, - - -, or n) connected to the frequency converter 2j (j=1,2, - - -, or n) for adjusting the level of the receiving signal by varying the amplification factor thereof, a quadrature detector 4j (j=1,2, - - -, or n) connected to the variable gain controlled amplifier 3j (j=1,2, - - -, or n) for producing I (i.e. in-phase) and Q (i.e. quadrature) signals from the receiving signal of IF frequency band, and A/D converters 5j and 6j (j=1,2, - - -, or n) connected to the quadrature detector 4j (j=1,2, - - -, or n) for converting the I and Q signals into digital signals.

The system further comprises an automatic gain control unit 7 receiving digital signals from the A/D converters 5j and 6j (j=1,2, - - -, or n) and controlling the amplification factors of variable gain controlled amplifiers $3_1$ through $3_n$, an adaptive antenna processing unit 8 receiving digital signals from the A/D converters 5j and 6j (j=1,2, - - -, or n) for synthesizing signals received in the plural antennas $1_1$ through $1_n$ and removing distortion, and a demodulator 81 connected to the adaptive antenna processing unit 8 for demodulating the receiving signals outputted from the adaptive antenna processing unit 8 and converting them into receiving data.

According to the fourth embodiment, as shown in FIG. 4, the automatic gain control unit 7 sends a control signal independently to each of the variable gain controlled amplifiers $3_1$ through $3_n$, thereby separately controlling the amplification factor of each amplifier 3j (j=1,2, - - -, or n). Furthermore, the automatic gain control unit 7 sends the adaptive antenna processing unit 8 information relating to the amplification factors of the variable gain controlled amplifiers $3_1$ through $3_n$.

According to the above-described fourth embodiment radio receiving system, the arriving radio wave is received by a total of "n" antennas $1_1$ through $1_n$ positioned at spatially different positions. The radio wave, received in each of the respective antennas $1_1$ through $1_n$, is converted into an IF signal in each of frequency converters $2_1$ through $2_n$. The signal level of the IF signal is adjusted in each of the variable gain controlled amplifier $3_1$ through $3_n$.

The receiving signal with a signal level thus adjusted is subsequently converted into an I signal (i.e. an in-phase component) and a Q signal (i.e. a quadrature component) in each of the quadrature detectors $4_1$ through $4_n$. The I signal and Q signal are then converted into digital data in respective A/D converters $5_1$ - - - $5_n$ and $6_1$ - - - $6_n$.

Thus converted digital signal is subsequently entered into the automatic gain control unit 7. The automatic gain control unit 7 independently control the amplification factor in each amplifier 3j (j=1,2, - - -, or n) in accordance with the I and Q signals of each branch j (j=1,2, - - -, or n), so as to assure a sufficient dynamic range of the following stage and reduce the quantization errors in the A/D converters $5_1$ - - - $5_n$ and $6_1$ - - - $6_n$.

In this case, the amplification factors of the variable gain controlled amplifiers $3_1$ through $3_n$ are independently controlled. Such individual control of amplification factors of variable gain controlled amplifiers $3_1$ through $3_n$ will not maintain the linearity among antennas $1_1$ through $1_n$ and an amplitude ratio among antennas $1_1$ through $1_n$ at the antenna input condition. Accordingly, the automatic gain control unit 7 gives the adaptive antenna processing unit 8 the information relating to the amplification factors of respective amplifiers $3_1$ through $3_n$.

Based on the information relating to the amplification factors of the variable gain controlled amplifiers $3_1$ through $3_n$, the adaptive antenna processing unit 8 corrects the linearity and the amplitude ratio among antennas $1_1$ through $1_n$ to be substantially equalized to the antenna input condition, processes the I and Q signals of respective branches after their signal levels are adjusted, and removes distortion components involved in the receiving signals. The demodulator 81 demodulates the receiving signals outputted from the adaptive antenna processing unit 8 and converting them into receiving data.

As described above, the fourth embodiment of the present invention provides a radio receiving system equipped with plural adaptive antennas which is capable of independently controlling the amplification factors of the variable gain controlled amplifiers $3_1$ through $3_n$. In other words, the amplification factor of each variable gain controlled amplifier 3j (j=1,2, - - -, or n) in its branch is separately controlled in accordance with the electric power of its receiving signal received by the corresponding antenna 1j (j=1,2, - - -, or n).

For this reason, in the A/D conversion in each branch, it becomes possible to suppress the quantization errors within a small value and, therefore, improve the performance in the adaptive antenna processing.

Fifth Embodiment

Figure 5:
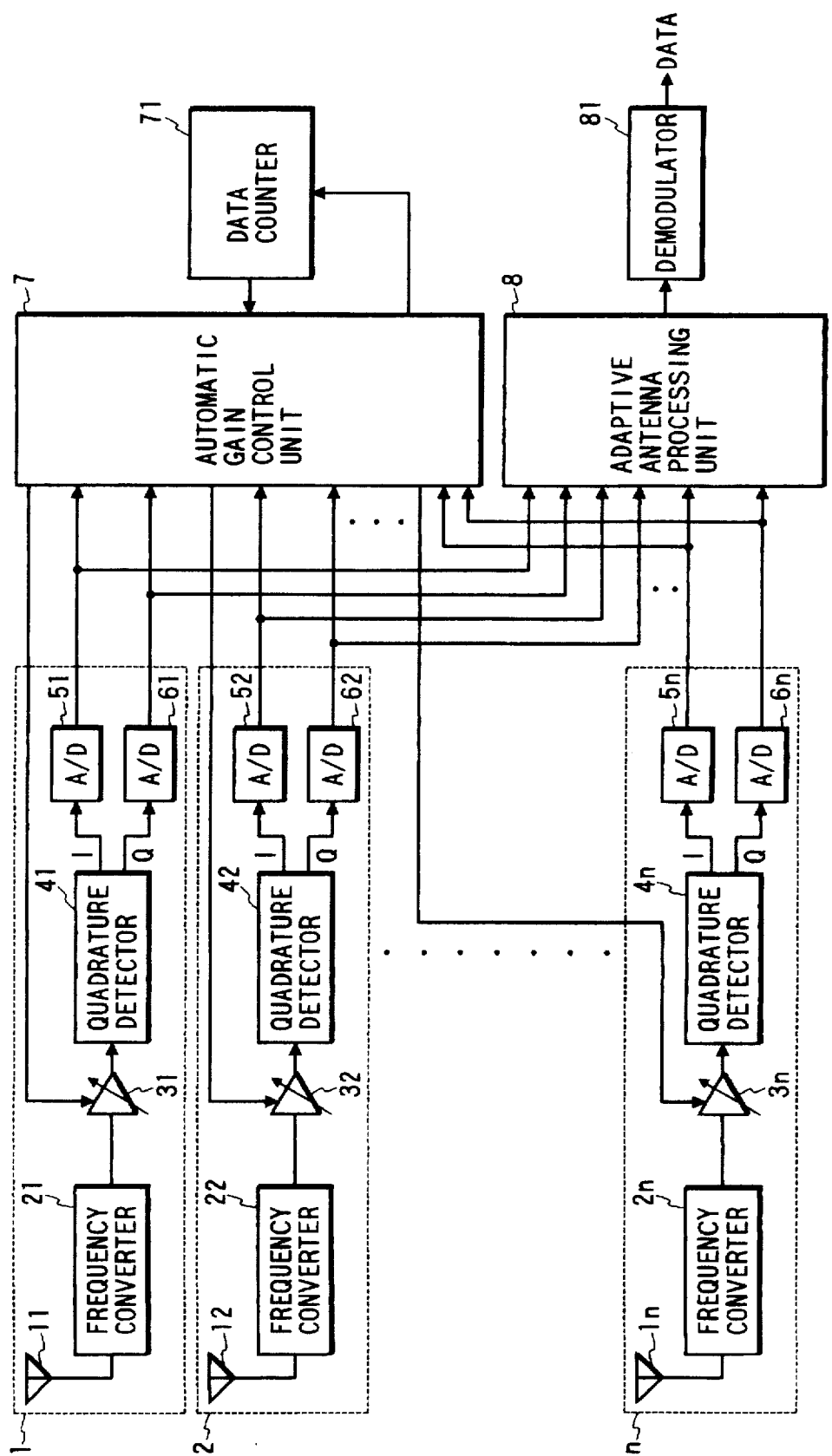
FIG. 5 is a block diagram showing a schematic arrangement of a radio receiving system equipped with plural adaptive antennas in accordance with a fifth embodiment of the present invention.

FIG. 5 is a schematic block diagram showing the fifth embodiment of the present invention which is characterized by the individual control of amplification factors of the variable gain controlled amplifiers $3_1$ through $3_n$ to be executed in response to every "m" times entry (or sampling) of receiving signal data.

The circuit arrangement of the fifth embodiment is substantially a combination of the first and fourth embodiments above described.

More specifically, the radio receiving system is equipped with a total of n adaptive antenna branches. As shown in FIG. 5, each branch j (j=1,2, - - -, or n) comprises an exclusive antenna 1j (j=1,2, - - -, or n) receiving radio wave signals, a frequency converter 2j (j=1,2, - - -, or n) connected to the antenna 1j (j=1,2, - - -, or n) for converting the receiving signal into an IF (intermediate frequency) signal, a variable gain controlled amplifier 3j (j=1,2, - - -, or n) connected to the frequency converter 2j (j=1,2, - - -, or n) for adjusting the level of the receiving signal by varying the amplification factor thereof, a quadrature detector 4j (j=1,2, - - -, or n) connected to the variable gain controlled amplifier 3j (j=1,2, - - -, or n) for producing I and Q signals from the receiving signal of IF frequency band, and A/D converters 5j and 6j (j=1,2, - - -, or n) connected to the quadrature detector 4j (j=1,2, - - -, or n) for converting the I and Q signals into digital signals.

The system further comprises an automatic gain control unit 7 receiving digital signals from the A/D converters 5j and 6j (j=1,2, - - -, or n) and controlling the amplification factors of variable gain controlled amplifiers $3_1$ through $3_n$, an adaptive antenna processing unit 8 receiving digital signals from the A/D converters 5j and 6j (j=1,2, - - -, or n) for synthesizing signals received in the plural antennas $1_1$ through $1_n$ and removing distortion, and a demodulator 81 connected to the adaptive antenna processing unit 8 for demodulating the receiving signals outputted from the adaptive antenna processing unit 8 and converting them into receiving data.

In addition to the above arrangement, the fifth embodiment of the present invention includes a data counter 71 which is connected to the automatic gain control unit 7 to count the number of receiving signals entered into the automatic gain control unit 7. The automatic gain controller 7 responds to a count-up data supplied from the data counter 71 to separately control the amplification factors of the variable gain controlled amplifiers $3_1$ through $3_n$ every time the data counter 71 counts up a predetermined number.

More specifically, the automatic gain control unit 7 performs the individual control of the variable gain controlled amplifiers $3_1$ through $3_n$ every time the data counter 71 counts to "m", outputting the information relating to the amplification factors of the variable gain controlled amplifiers $3_1$ through $3_n$ to the adaptive antenna processing unit 8 upon execution of this control.

Based on the information relating to the amplification factors of the variable gain controlled amplifiers $3_1$ through $3_n$, the adaptive antenna processing unit 8 corrects the linearity and the amplitude ratio among antennas $1_1$ through $1_n$ to be substantially equalized to the antenna input condition, processes the I and Q signals of respective branches after their signal levels are adjusted, and removes distortion components involved in the receiving signals.

When compared with the fourth embodiment, the fifth embodiment is advantageous in the reduction of arithmetic time or volume for the control of amplification factors of variable gain controlled amplifiers $3_1$ through $3_n$, or for the adaptive antenna processing, and the reduction of data amount transmitted from the automatic gain control unit 7 to the adaptive antenna processing unit 8. Hence, an overall amount of consumption current can be reduced effectively. Furthermore, the fluctuation of amplification factors of variable gain controlled amplifiers $3_1$ through $3_n$ can be suppressed, with improvement of performance in the adaptive antenna processing.

Sixth Embodiment

Figure 6:
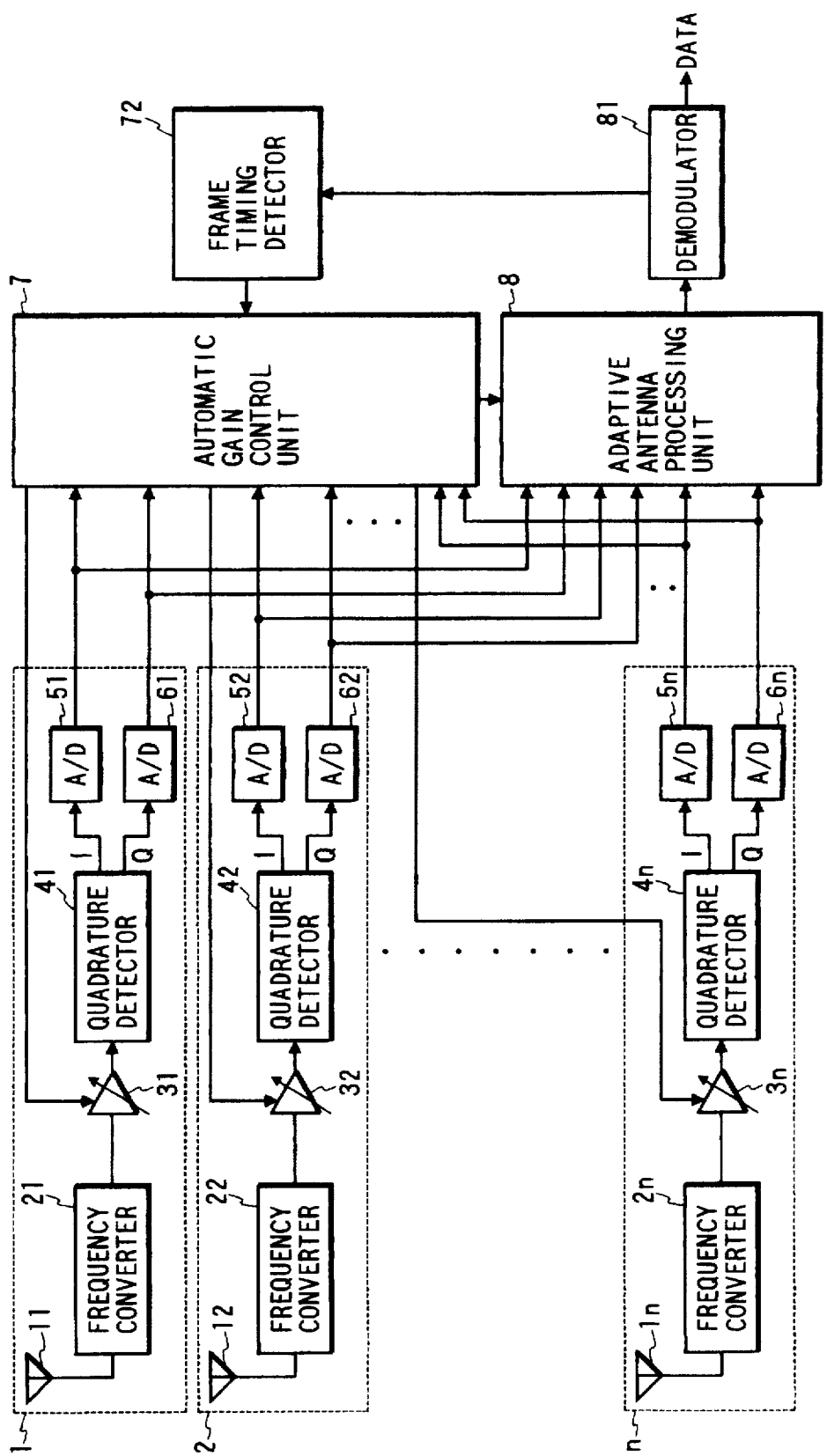
FIG. 6 is a block diagram showing a schematic arrangement of a radio receiving system equipped with plural adaptive antennas in accordance with a sixth embodiment of the present invention.

FIG. 6 is a schematic block diagram showing the sixth embodiment of the present invention which is characterized by the individual control of amplification factors of the variable gain controlled amplifiers $3_1$ through $3_n$ to be executed in response to every elapse of the predetermined interval equivalent to the units of the designated frame (or the units of a multiple of the designated frame).

The circuit arrangement of the sixth embodiment is substantially a combination of the second and fourth embodiments above described.

More specifically, the radio receiving system is equipped with a total of n adaptive antenna branches. As shown in FIG. 6, each branch j (j=1,2, - - -, or n) comprises an exclusive antenna 1j (j=1,2, - - -, or n) receiving radio wave signals, a frequency converter 2j (j=1,2, - - -, or n) connected to the antenna 1j (j=1,2, - - -, or n) for converting the receiving signal into an IF (intermediate frequency) signal, a variable gain controlled amplifier 3j (j=1,2, - - -, or n) connected to the frequency converter 2j (j=1,2, - - -, or n) for adjusting the level of the receiving signal by varying the amplification factor thereof, a quadrature detector 4j (j=1,2, - - -, or n) connected to the variable gain controlled amplifier 3j (j=1,2, - - -, or n) for producing I and Q signals from the receiving signal of IF frequency band, and A/D converters 5j and 6j (j=1,2, - - -, or n) connected to the quadrature detector 4j (j=1,2, - - -, or n) for converting the I and Q signals into digital signals.

The system further comprises an automatic gain control unit 7 receiving digital signals from the A/D converters 5j and 6j (j=1,2, - - -, or n) and controlling the amplification factors of variable gain controlled amplifiers $3_1$ through $3_n$, an adaptive antenna processing unit 8 receiving digital signals from the A/D converters 5j and 6j (j=1,2, - - -, or n)

for synthesizing signals received in the plural antennas $1_1$ through $1_n$ and removing distortion, and a demodulator 81 connected to the adaptive antenna processing unit 8 for demodulating the receiving signals outputted from the adaptive antenna processing unit 8 and converting them into receiving data.

In addition to the above arrangement, the sixth embodiment of the present invention includes a frame timing detector 72. The frame timing detector 72 of the sixth embodiment, connected between the demodulator 81 and the automatic gain control unit 7, detects the units of frame, such as a TDM (Time Division Multiplex) frame, a TDMA (Time Division Multiple Access) frame, a frame of interleave or a frame of error correction, based on the demodulated signals.

The automatic gain control unit 7 separately controls the amplification factors of the variable gain controlled amplifiers $3_1$ through $3_n$ in response to every detection of the designated timing detected by the frame timing detector 72. Namely, the automatic gain control unit 7 performs the individual control of the variable gain controlled amplifiers $3_1$ through $3_n$ in response to the control timing signal sent from the frame timing detector 72, outputting the information relating to the amplification factors of the variable gain controlled amplifiers $3_1$ through $3_n$ to the adaptive antenna processing unit 8 upon execution of this control.

Based on the information relating to the amplification factors of the variable gain controlled amplifiers $3_1$ through $3_n$, the adaptive antenna processing unit 8 corrects the linearity and the amplitude ratio among antennas $1_1$ through $1_n$ to be substantially equalized to the antenna input condition, processes the I and Q signals of respective branches after their signal levels are adjusted, and removes distortion components involved in the receiving signals.

Accordingly, the control of the amplification factors of variable gain controlled amplifiers $3_1$ through $3_n$ is performed at predetermined intervals equivalent to the units of the designated frame (or the units of a multiple of the designated frame).

When compared with the fourth embodiment, the sixth embodiment is advantageous in the reduction of arithmetic time or volume for the control of amplification factors of variable gain controlled amplifiers $3_1$ through $3_n$ or for the adaptive antenna processing, and the reduction of data amount transmitted from the automatic gain control unit 7 to the adaptive antenna processing unit 8. Hence, an overall amount of consumption current can be reduced effectively. Furthermore, the fluctuation of amplification factors of variable gain controlled amplifiers $3_1$ through $3_n$ can be suppressed, with improvement of performance in the adaptive antenna processing.

Seventh Embodiment

Figure 7:
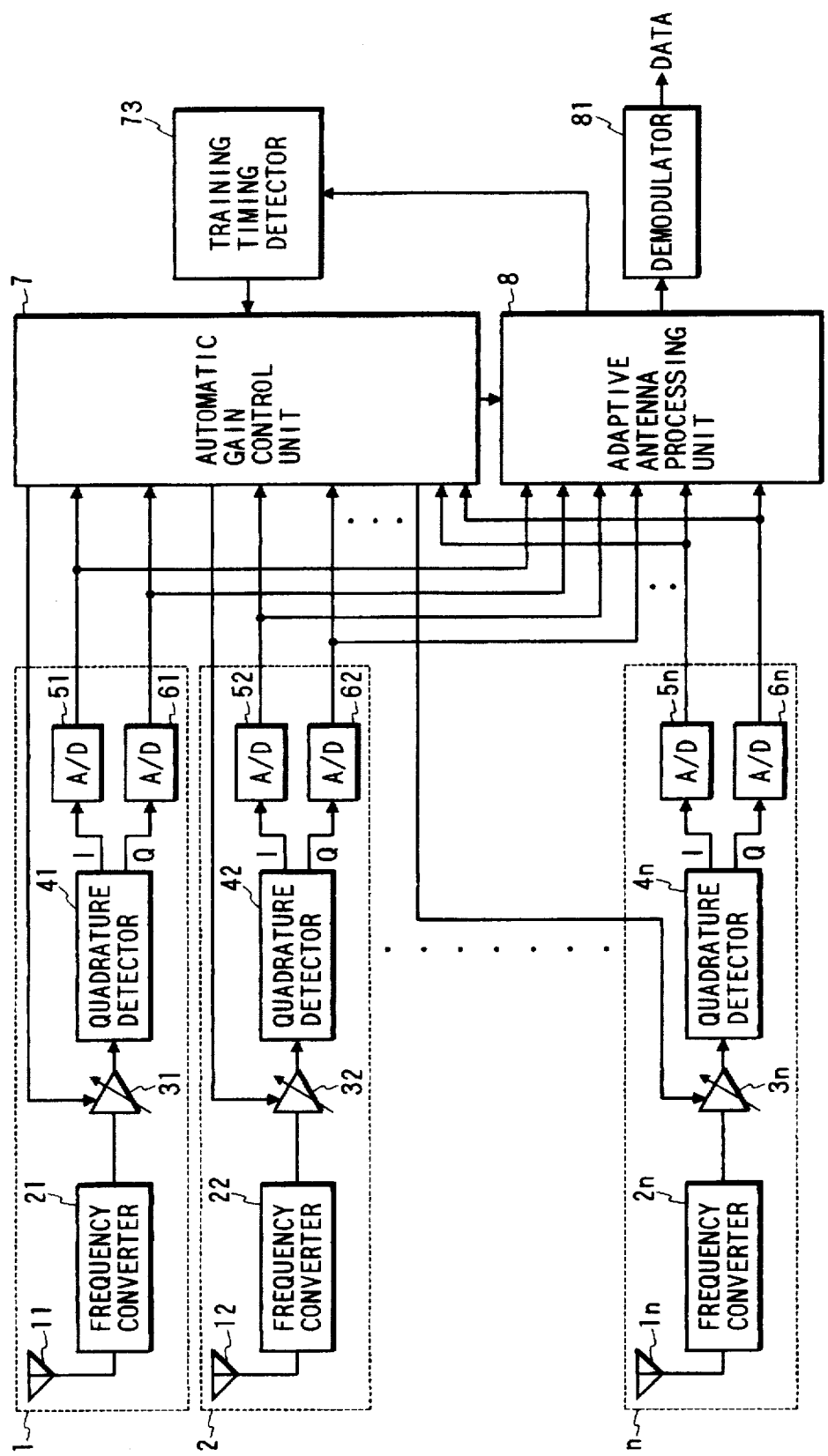
FIG. 7 is a block diagram showing a schematic arrangement of a radio receiving system equipped with plural adaptive antennas in accordance with a seventh embodiment of the present invention.
Figure 8:
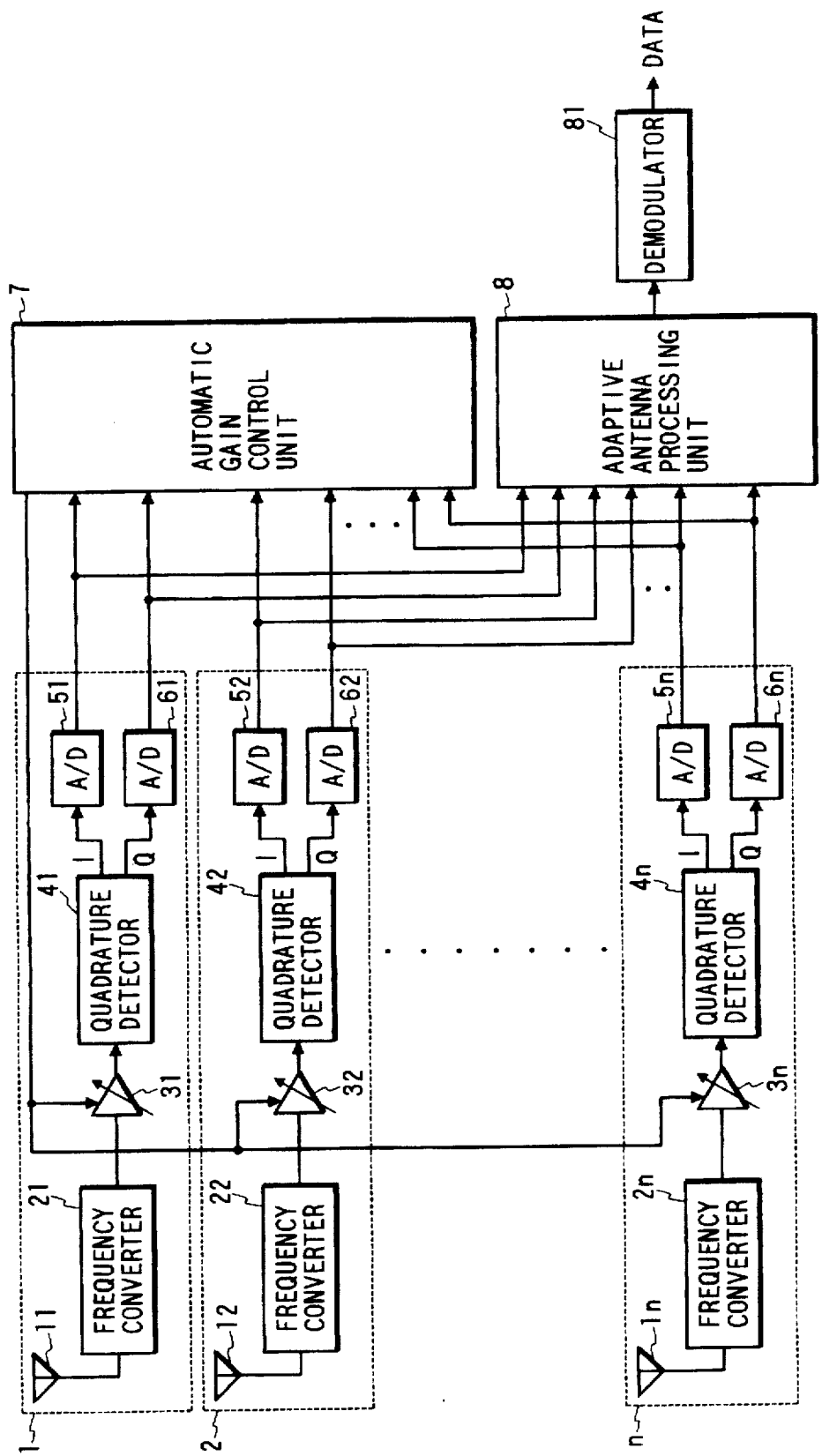
FIG. 8 is a block diagram showing a schematic arrangement of a conventional radio receiving system equipped with plural adaptive antennas.
Figure 9:
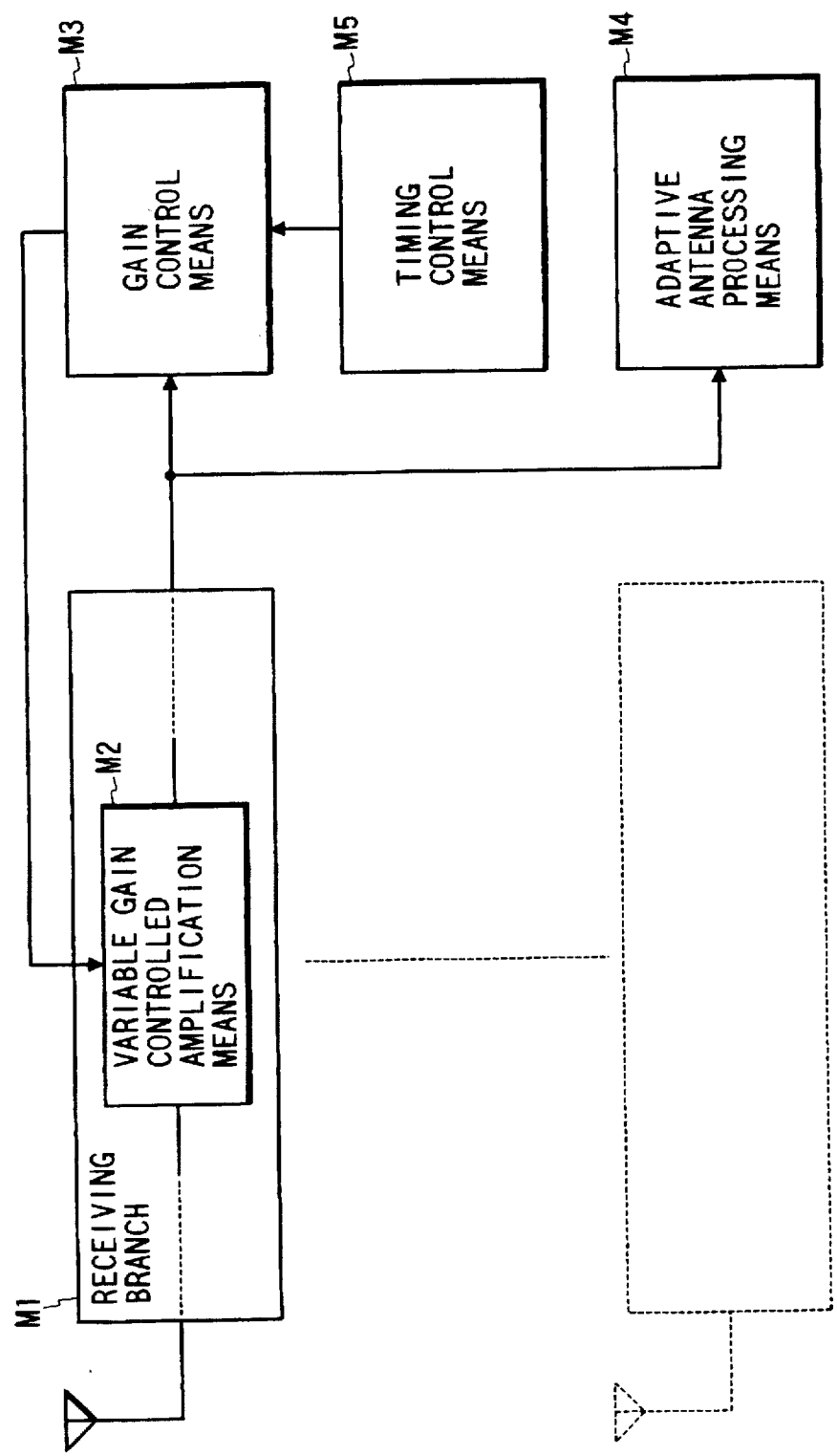
FIG. 9 is a block diagram showing functional blocks constituting a radio receiving system in accordance with a first aspect of the present invention.
Figure 10:
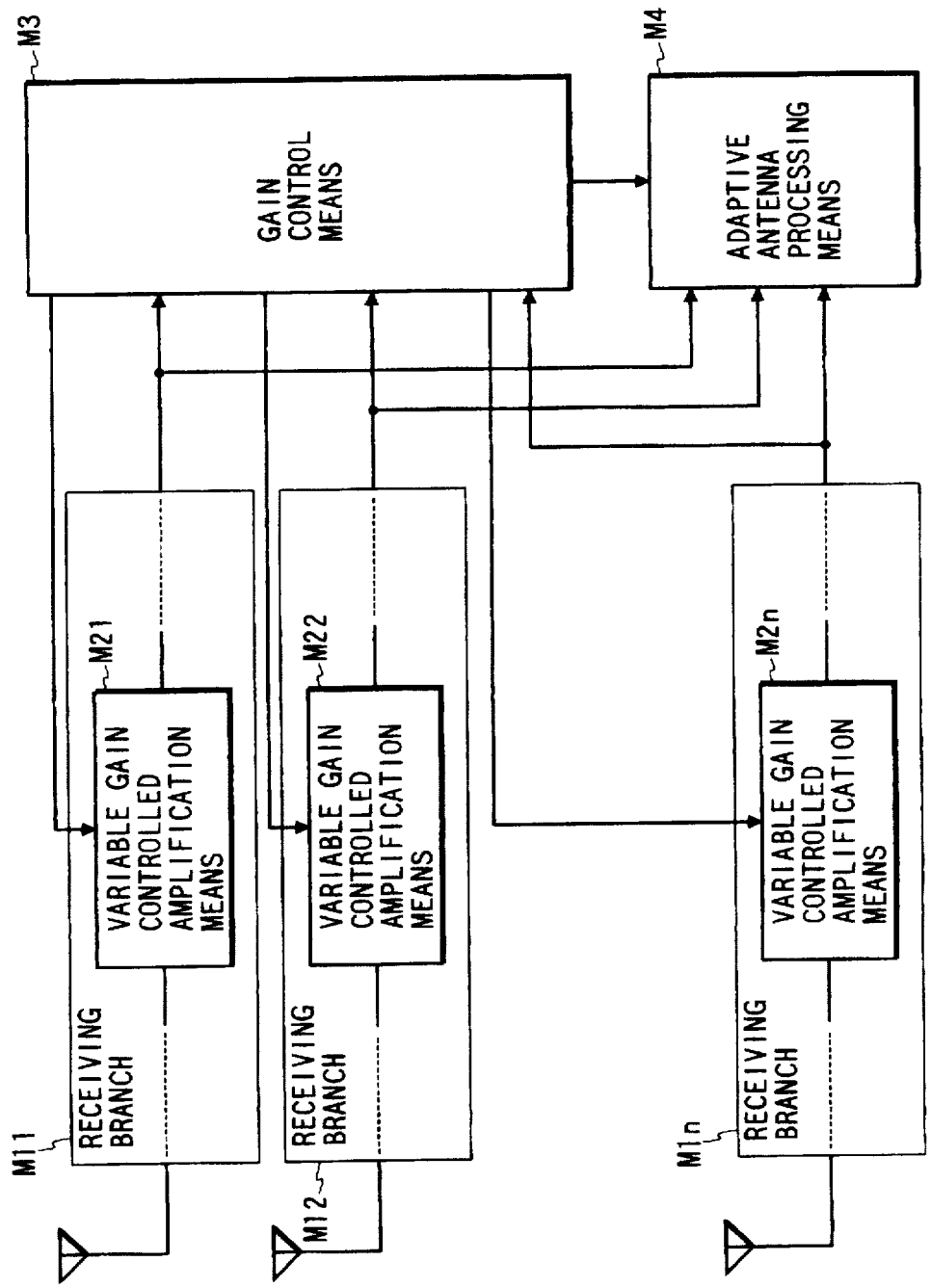
FIG. 10 is a block diagram showing functional blocks constituting a radio receiving system in accordance with a second aspect of the present invention.
Figure 11:
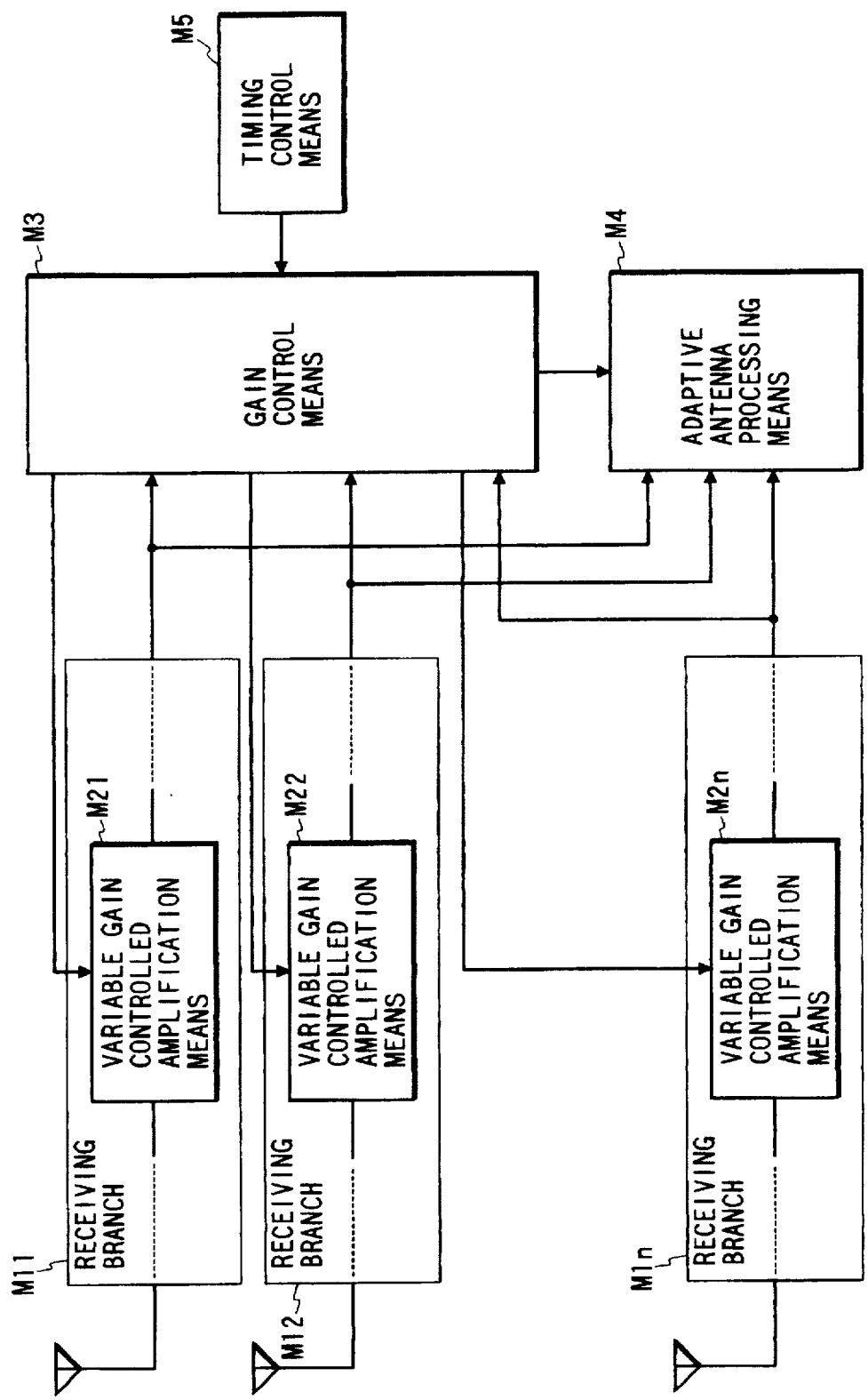
FIG. 11 is a block-diagram showing functional blocks constituting a radio receiving system in accordance with a third aspect of the present invention.

FIG. 7 is a schematic block diagram showing the seventh embodiment of the present invention which is characterized by the individual control of amplification factors of the variable gain controlled amplifiers $3_1$ through $3_n$ to be executed every time the training sequence is executed in the adaptive antenna processing unit 8 when it uses the algorithm requiring a training sequence, such as Least Mean Square Error (LMS) algorithm or the like.

The circuit arrangement of the seventh embodiment is substantially a combination of the third and fourth embodiments above described.

More specifically, the radio receiving system is equipped with a total of n adaptive antenna branches. As shown in FIG. 7, each branch j (j=1,2, - - - , or n) comprises an exclusive antenna 1j (j=1,2, - - - , or n) receiving radio wave signals, a frequency converter 2j (j=1,2, - - - , or n) connected to the antenna 1j (j=1,2, - - - , or n) for converting the receiving signal into an IF (intermediate frequency) signal, a variable gain controlled amplifier 3j (j=1,2, - - - , or n) connected to the frequency converter 2j (j=1,2, - - - , or n) for adjusting the level of the receiving signal by varying the amplification factor thereof, a quadrature detector 4j (j=1,2, - - - , or n) connected to the variable gain controlled amplifier 3j (j=1,2, - - - , or n) for producing I and Q signals from the receiving signal of IF frequency band, and A/D converters 5j and 6j (j=1,2, - - - , or n) connected to the quadrature detector 4j (j=1,2, - - - , or n) for converting the I and Q signals into digital signals.

The system further comprises an automatic gain control unit 7 receiving digital signals from the A/D converters 5j and 6j (j=1,2, - - - , or n) and controlling the amplification factors of variable gain controlled amplifiers $3_1$ through $3_n$, an adaptive antenna processing unit 8 receiving digital signals from the A/D converters 5j and 6j (j=1,2, - - - , or n) for synthesizing signals received in the plural antennas $1_1$ through $1_n$ and removing distortion, and a demodulator 81 connected to the adaptive antenna processing unit 8 for demodulating the receiving signals outputted from the adaptive antenna processing unit 8 and converting them into receiving data.

In addition to the above arrangement, the seventh embodiment of the present invention includes a training timing detector 73. The training timing detector 73 of the seventh embodiment, connected between the adaptive antenna processing unit 7 and the automatic gain control unit 7, detects an initiation of the training sequence in the adaptive antenna processing unit 8, in order to perform the control of the variable gain controlled amplifiers $3_1$ through $3_n$ once during the interval of the concerned training sequence. The training timing detector 73 generates a control timing signal upon detecting the initiation of training sequence in the adaptive antenna processing unit 8.

The automatic gain control unit 7 separately controls the amplification factors of the variable gain controlled amplifiers $3_1$ through $3_n$ in response to every control signal sent from the training timing detector 73. Namely, the automatic gain control unit 7 performs the individual control of the variable gain controlled amplifiers $3_1$ through $3_n$ in response to the control timing signal sent from the training timing detector 73, outputting the information relating to the amplification factors of the variable gain controlled amplifiers $3_1$ through $3_n$ to the adaptive antenna processing unit 8 upon execution of this control.

Based on the information relating to the amplification factors of the variable gain controlled amplifiers $3_1$ through $3_n$, the adaptive antenna processing unit 8 corrects the linearity and the amplitude ratio among antennas $1_1$ through $1_n$ to be substantially equalized to the antenna input condition, processes the I and Q signals of respective branches after their signal levels are adjusted, and removes distortion components involved in the receiving signals.

Accordingly, the control of the amplification factors of variable gain controlled amplifiers $3_1$ through $3_n$ is performed at predetermined intervals equivalent to the units of the designated training interval (or the units of a multiple of the designated training interval).

When compared with the fourth embodiment, the seventh embodiment is advantageous in the reduction of arithmetic time or volume for the control of amplification factors of variable gain controlled amplifiers $3_1$ through $3_n$, or for the adaptive antenna processing, and the reduction of data amount transmitted from the automatic gain control unit 7 to the adaptive antenna processing unit 8. Hence, an overall amount of consumption current can be reduced effectively. Furthermore, the fluctuation of amplification factors of variable gain controlled amplifiers $3_1$ through $3_n$ can be suppressed, with improvement of performance in the adaptive antenna processing.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A radio receiving system comprising:
   a plurality of adaptive antennas;
   a plurality of receiving branches, each being associated with a corresponding one of said adaptive antennae for a receiving signal sent thereto from the associated adaptive antenna;
   variable gain controlled amplification means provided in each receiving branch for setting an amplification factor for said receiving signal in each receiving branch;
   adaptive antenna processing means for performing an adaptive antenna processing at predetermined sampling intervals based on the receiving signals sent from said plurality of receiving branches for obtaining a synthesized adaptive signal;
   gain control means for controlling said amplification factor of each variable gain controlled amplification means; and
   timing control means for prohibiting said gain control means to renew said simplification factor of each variable gain controlled amplification means based on the receiving signals sampled in the latest sampling interval and allowing said gain control means to renew said amplification factor of each variable gain controlled amplification means in response to a lapse of a predetermined time equivalent to a plurality of sampling intervals.

2. The radio receiving system defined by claim 1, wherein said timing control means comprises a counting means for counting a number of sampling operations performed, and said gain control means is allowed to renew the amplification factor of each variable gain controlled amplification means every time a count number of said counting means reaches "m", where "m" is an integer larger than 1.

3. The radio receiving system defined by claim 1, wherein said timing control means comprises a frame timing detecting means for detecting a frame unit in the receiving signal, and said gain control means is allowed to renew the amplification factor of each variable gain controlled amplification means every time said frame timing detecting means detects "n" frames, where "n" is an integer not smaller than 1.

4. The radio receiving system defined by claim 1, wherein said timing control means is a training timing detecting means for detecting a training interval in said adaptive antenna processing means, and said gain control means is allowed to renew the amplification factor of each variable gain controlled amplification means every time said training timing detecting means detects said training interval.

5. A radio receiving system comprising:
   a plurality of adaptive antennas;
   a plurality of receiving branches, each being associated with one of said adaptive antennas for a receiving signal sent from the associated adaptive antenna;
   variable gain controlled amplification means provided in each receiving branch for setting an amplification factor for said receiving signal in each receiving branch;
   adaptive antenna processing means for performing an adaptive antenna processing at predetermined sampling intervals based on the receiving signals sent from said plurality of receiving branches for obtaining a synthesized adaptive signal;
   gain control means for controlling said amplification factor of each of said variable gain controlled amplification means; and
   timing control means for prohibiting said gain control means to renew said amplification factor of each variable gain controlled amplification means for a predetermined time longer than a sampling interval and allowing said gain control means to renew said amplification factor in response to a lapse of said predetermined time,
   wherein said gain control means controls the amplification factor of each variable gain controlled amplification means independently at a predetermined timing.

6. A radio receiving system comprising:
   a plurality of adaptive antennas;
   a plurality of receiving branches, each being associated with one of said adaptive antennas for a receiving signal sent from the associated adaptive antenna;
   variable gain controlled amplification means provided in each receiving branch for setting an amplification factor for said receiving signal in each receiving branch;
   adaptive antenna processing means for performing an adaptive antenna processing at predetermined sampling intervals based on the receiving signals sent from said plurality of receiving branches for obtaining a synthesized adaptive signal;
   gain control means for controlling said amplification factor of each variable gain controlled amplification means; and
   timing control means for prohibiting said gain control means to renew said amplification factor of each variable gain controlled amplification means based on the receiving signals sampled in the latest sampling interval and allowing said gain control means to renew said amplification factor of each variable gain controlled amplification means in response to a lapse of a predetermined time equivalent to a plurality of sampling intervals,
   wherein said gain control means controls the amplification factor of each variable gain controlled amplification means independently.

7. The radio receiving system defined by claim 6, wherein said timing control means comprises a counting means for counting a number of sampling operation performed, and said gain control means is allowed to renew the amplification factor of each variable gain controlled amplification means every time a count number of said counting means reaches "m", where "m" is an integer larger than 1.

8. The radio receiving system defined by claim 6, wherein said timing control means comprises a frame timing detecting means for detecting a frame unit in the receiving signal, and said gain control means is allowed to renew the amplification factor of each variable gain controlled amplification means every time said frame timing detecting means detects "n" frames, where "n" is an integer not smaller than 1.

9. The radio receiving system defined by claim 6, wherein said timing control means is a training timing detecting means for detecting a training interval in said adaptive antenna processing means, and said gain control means is allowed to renew the amplification factor of each variable gain controlled amplification means every time said training timing detecting means detects said training interval.

10. A radio receiving system comprising:

n adaptive antennas;

n receiving branches, each being associated with a corresponding one of said n adaptive antennas for a receiving signal sent from the associated adaptive antenna;

variable gain controlled amplification means provided in each receiving branch for adjusting an amplification factor for said receiving signal in each receiving branch;

gain control means for commonly controlling a gain control signal based on outputs of respective variable gain controlled amplification means, and operating to maintain an output of said variable gain controlled amplification means at a constant value as a time averaged value; and adaptive antenna processing means for processing amplification factor information of said variable gain controlled amplification means in each receiving branch and for processing the receiving signals of respective receiving branches, wherein renewal of said amplification factor is prohibited for a predetermined time longer than a sampling interval and, said amplification factor of said variable gain controlled amplification means is controlled in response to m samples of reception data where m is an integer not equal to one, so that an amount of signal processing and current consumption in said gain control means can be reduced.

11. The radio receiving system in accordance with claim 10, wherein:

a frame unit for a time division process is used for a fundamental processing unit for communications;

said gain control means controls said amplification factor of said variable gain controlled amplification means every m frames so as to reduce the amount of signal processing in said gain control means, and the amplification factor of said variable gain controlled amplification means is maintained at a constant value within a same frame unit, so that a deterioration due to fluctuation of the amplification factor of said variable gain controlled amplification means is reduced in adaptive antenna processing, thereby improving performance of the adaptive antenna processing and total performance of said receiving system.

12. The radio receiving system in accordance with claim 11, wherein said time division process comprises a time division multiplexing process.

13. The radio receiving system in accordance with claim 11, wherein said time division process comprises a time division multiple access process.

14. The radio receiving system in accordance with claim 10, wherein said adaptive antenna processing means implements a training sequence for enabling use of an algorithm to renew adaptive antenna characteristics cyclically according to the training sequence;

said gain control means controls said amplification factor of said variable gain controlled amplification means in synchronism with said training sequence so as to reduce the amount of signal processing in said gain control means, and the amplification factor of said variable gain controlled amplification means is maintained at a constant value within a training sequence unit, so that a deterioration due to fluctuation of the amplification factor of said variable gain controlled amplification means is reduced in adaptive antenna processing, thereby improving performance of the adaptive antenna processing and total performance of said receiving system.

15. A radio receiving system comprising:

n adaptive antennas;

n receiving branches, each being associated with one of said n adaptive antennas for a receiving signal sent from the associated adaptive antenna;

variable gain controlled amplification means provided in each receiving branch for adjusting an amplification factor for said receiving signal in each receiving branch;

gain control means for independently controlling a gain control signal based on an output of each variable gain controlled amplification means, and operating to maintain an output of said variable gain controlled amplification means at a constant value as a time averaged value; and adaptive antenna processing means for processing amplification factor information of said variable gain controlled amplification means in each receiving branch and for processing the receiving signals of respective receiving branches, wherein renewal of said amplification factor is prohibited for a predetermined time longer than a sampling interval and, each receiving branch adjusts a signal level so as to suppress a quantized error amount to a signal amplitude in an analog-digital conversion performed after the amplification in said variable gain controlled amplification means in each receiving branch, thereby improving a performance of adaptive antenna processing and total performance of said receiving system.

16. The radio receiving system in accordance with claim 15, wherein said gain control means controls said amplification factor of said variable gain controlled amplification means in response to m samplings of reception data where m is an integer not equal to one, thereby reducing an amount of signal processing in said gain control means and in said adaptive antenna processing.

17. The radio receiving system in accordance with claim 15, wherein:

a frame unit for a time division process is used for a fundamental processing unit for communications;

said gain control means controls said amplification factor of said variable gain controlled amplification means every m frames so as to reduce an amount of signal processing in said gain control means and in said adaptive antenna processing, and the amplification factor of said variable gain controlled amplification means is maintained at a constant value within a same frame unit, so that a deterioration due to fluctuation of the amplification factor of said variable gain controlled amplification means is reduced in said adaptive antenna processing, thereby improving performance of said adaptive antenna processing and total performance of said receiving system.

18. The radio receiving system in accordance with claim 17, wherein said time division process comprises a time division multiplexing process.

19. The radio receiving system in accordance with claim 17, wherein said time division process comprises a time division multiple access process.

20. The radio receiving system in accordance with claim 15, wherein said adaptive antenna processing means implements a; training sequence for enabling use of an algorithm to renew adaptive antenna characteristics cyclically according to the training sequence;

said gain control means controls said amplification factor of said variable gain controlled amplification means in synchronism with said training sequence so as to reduce the amount of signal processing in said gain control means and in said adaptive antenna processing, and the amplification factor of said variable gain controlled amplification means is maintained at a constant value within a training sequence unit, so that a deterioration due to fluctuation of the amplification factor of said variable gain controlled amplification means is reduced in adaptive antenna processing, thereby improving performance of said adaptive antennas and total performance of said receiving system.

* * * * *